United States Patent [19]  [11] Patent Number: 4,812,663
Douglas-Hamilton et al.  [45] Date of Patent: Mar. 14, 1989

[54] CALORIMETRIC DOSE MONITOR FOR ION IMPLANTATION EQUIPMENT

[75] Inventors: D. H. Douglas-Hamilton, Beverly; John P. Ruffell, Wenham, both of Mass.

[73] Assignee: Eaton Corporation, Cleveland, Ohio

[21] Appl. No.: 890,312

[22] Filed: Jul. 25, 1986

[51] Int. Cl.⁴ .................. H01J 37/20; G21K 5/08
[52] U.S. Cl. ..................... 250/492.2 R; 250/443.1; 250/492.3
[58] Field of Search ............. 250/492.21, 492.3, 492.2, 250/443.1

[56] References Cited

U.S. PATENT DOCUMENTS

| | | | |
|---|---|---|---|
| 2,921,972 | 1/1960 | Kreisler et al. | 374/32 |
| 3,508,056 | 4/1970 | Fricke | 374/32 |
| 4,110,625 | 8/1978 | Cairns et al. | 250/492.2 |
| 4,419,584 | 12/1983 | Benneniste | 250/492.2 |
| 4,522,511 | 6/1985 | Zimmerer | 374/32 |
| 4,587,433 | 5/1986 | Farley | 250/492.2 |
| 4,628,209 | 12/1986 | Wittkower | 250/492.2 |

FOREIGN PATENT DOCUMENTS 0124344 7/1985 Japan ........................ 250/492.2

Primary Examiner—Bruce C. Anderson
Assistant Examiner—Michael Aronoff
Attorney, Agent, or Firm—Watts, Hoffmann, Fisher & Heinke

[57] ABSTRACT

A dose measurement system for ion implantation equipment based on the thermal energy deposited by the ion beam on a calibrated mass which periodically intercepts the beam. The method is insensitive to the ambient electrons which are present in the ion implanter volume. The method is also independent of processes in which the energetic ion changes its charge along its beam path. Thus, the invention solves problems of conventional does measuring system based on charge collection requiring exclusion of free electrons from the collector and compensation for the component of the implanted beam which is un-ionized and hence unrecorded by the charge collector. The simplicity and compactness of the calorimeter method has further advantages, in particular, the calorimeter solves the problem of making dose measurements in restricted spaces.

10 Claims, 5 Drawing Sheets

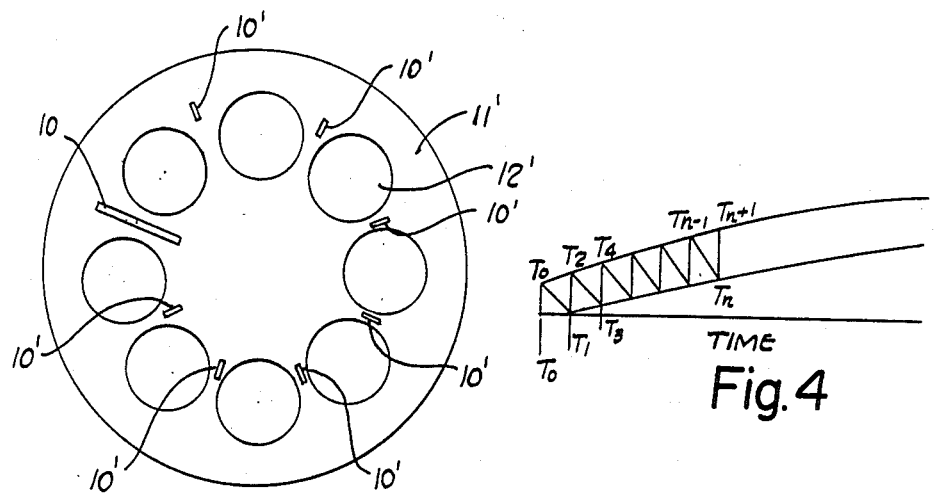
Fig. 5
Fig. 4
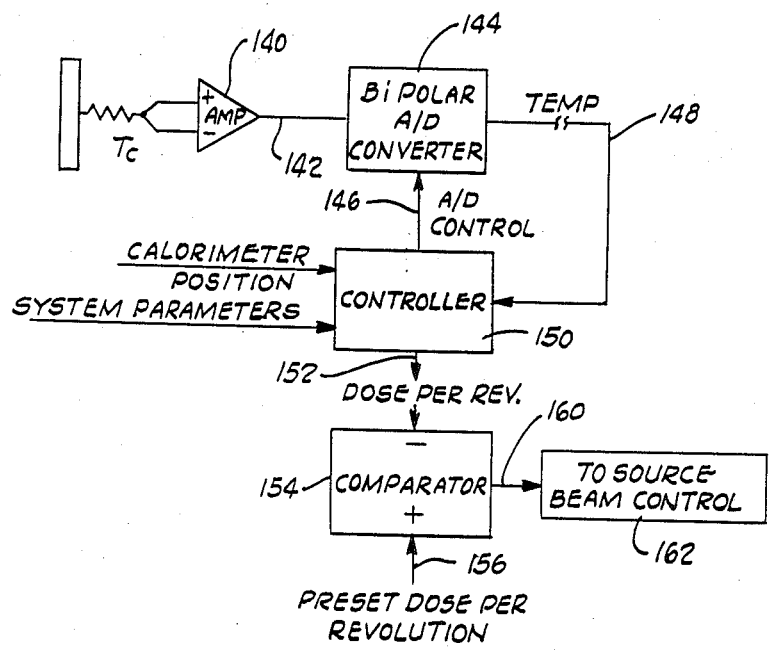
Fig. 6

CALORIMETRIC DOSE MONITOR FOR ION IMPLANTATION EQUIPMENT

TECHNICAL FIELD

The present invention relates to an ion beam implanter and more particularly relates to method and apparatus for measuring ion beam dose.

BACKGROUND ART

The doping of electrically active elements into semiconductors is now done almost exclusively by injecting the elements into a semiconductor material by means of instruments known as ion implanters. Ion implanters create highly controlled beams of suitable ions and direct these ions to impinge upon semiconductor wafers to dope the wafers in a uniform and known manner. An essential component of an ion implanter is a device to determine the implantation dose to provide an accurate measure of the total number of nuclei implanted and the relative uniformity of that implant over the wafer area. The present state of the semiconductor technology demands that the implantation dose be uniform to 1% over the wafer area and that the absolute number of implanted nuclei be controlled to at least 2%.

A number of methods have been used for the measurement of implantation dose. A method that is presently standard in the industry is to measure the total charge delivered by the ion beam into a Faraday cage. For reliable measurements it is necessary to exclude electrons which are present in the implantation volume and it is necessary to account for the presence of neutral particles which do not register in the Faraday cage. Both these problems have been solved for Faraday cages used for determining the dose of relatively small beams, typically a few square cm in area.

Faraday cages of practical size are not so well suited to the measurement of beams with cross-sectional areas of 10 cm$^2$ or more. For beams of this size and larger, the required large opening of the Faraday cage makes it difficult to prevent electrons from leaking in or out of the active cage volume. Moreover, the conventional design in which the length of the Faraday cage is very large compared to the size of the opening, can pose severe practical problems if space is at a premium.

DISCLOSURE OF THE INVENTION

The present invention overcomes many of the problems encountered with prior art dose measuring techniques. The invention has improved utility in measuring ion beams of large cross-sectional area and is insensitive to ambient electrons in the beam volume. The invention provides a reliable measure of the total implantation dose, one of the most important variables in an ion implantation system.

The invention measures the ion implantation dose by sampling the thermal energy the beam deposits in a calorimeter of specified mass and area normal to the beam. The total number of nuclei implanted into the semiconductor workpiece is then given by the energy deposited in the calorimeter mass divided by the known energy of each implanted nucleus. Dividing the number of nuclei by the area of the calorimeter exposed to the beam yields the total number of nuclei implanted per unit area.

Calorimetric techniques for measuring the power dissipated in a workpiece are known. Applicants are unaware, however, of any prior art calorimetric technique, to measure and control ion beams for ion implantation. The fact that the calorimetric method is insensitive to the electron flux in the ion implanter volume, that it is insensitive to secondary processes such as charge changing and sputtering, and that it can be applied to large area beams has important advantages in doping of semiconductors.

The calorimeter is used to obtain both the total dose and the uniformity of the implant across the diameter of the workpiece; the latter is done through the use of multiple calorimeters placed to intercept different portions of the ion beam. Use of short-time constant calorimeters also makes it possible to determine the dose as a function of time for use as a control in the implantation process.

The energy deposited in the calorimeter is measured as the time integral of the thermal power which flows from the calorimeter through a thermal path to a heat sink of fixed temperature. It is an important aspect of this invention that more than 99% of the energy into the calorimeter leaves as heat flow through a specific thermal path. The thermal power which passes along the path is determined by the temperature difference, as a function of time, between two fixed points of that path.

The measurements of temperature along the thermal path can be made by known techniques. The method used in the preferred embodiment of the invention makes use of commercially available thermisters whose resistance is a known function of temperature. The resistance values of the thermisters are readily measured as electrical signals which are digitized and used to control total implantation dose. These output signals indicate the total number of ions implanted per unit area into the workpiece and also give the dose rate as a function of time.

In an embodiment in which the workpiece is one of many on a holder, such as a spinning disc, that moves the workpieces past the beam in a cyclical manner, the calorimeter is a separate mass placed between the workpieces to sample the ion beam just as the workpieces sample the ion beam. In this embodiment it is important that the sampling frequency be fast compared to the time of fluctuations in the ion beam current.

The time-constant and temperature range of the calorimeter can be changed to accommodate different applications. Long time constant calorimetry is used to obtain total dose per unit area and short time constant calorimetry is used to obtain implantation dose per revolution of the wafer holder.

One object of the invention is an accurate, convenient means of measuring ion beam dose. This and other objects, advantages and features of the invention will become understood by a review of a preferred embodiment of the invention described in conjunction with the accompanying drawings.

BRIEF DESCRIPTION OF THE DRAWINGS

FIG. 4 is a graph showing sensed temperature vs. time at a point on a thermal path having a high coefficient of thermal conductivity;

FIG. 5 is an alternative spinning disk ion implantation arrangement where multiple calorimeters are spaced to measure ion beam uniformity;

FIG. 6 is a schematic of a control system for controlling ion beam characteristics based upon calorimeter measurements; and FIGS. 7, 7A and 8 illustrate alternate ion implantation systems using calorimeter measurements to control beam dose.

BEST MODE FOR CARRYING OUT THE INVENTION

Figure 1:
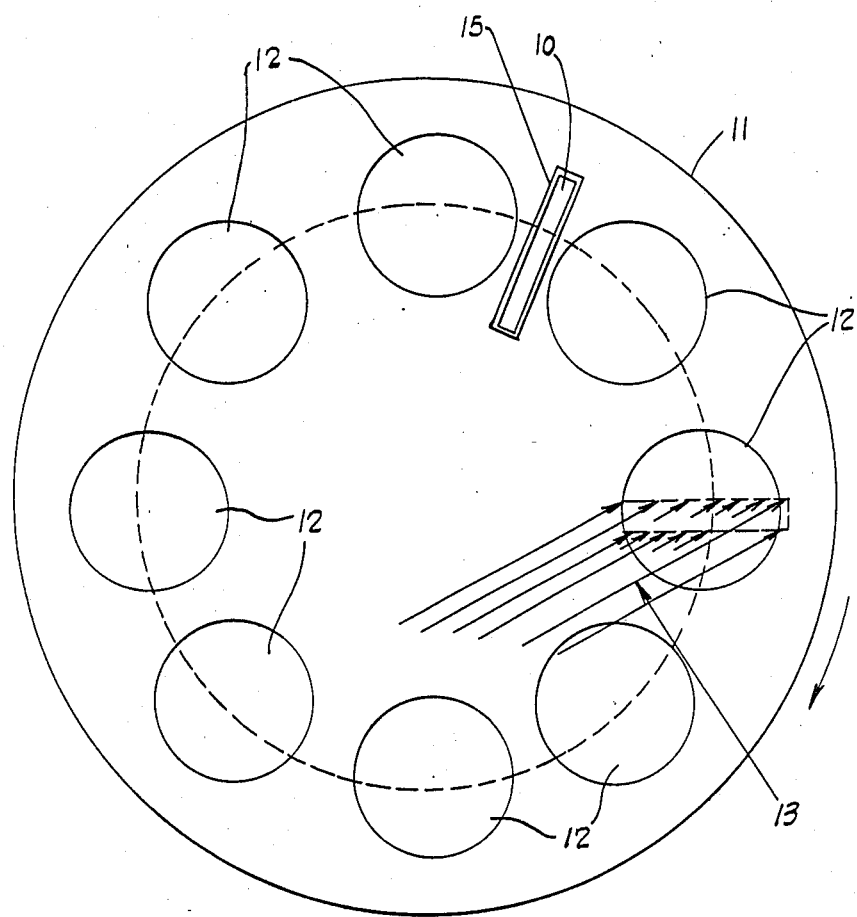
FIG. 1 is a schematic view of an ion implantation system in which the workpieces are held on a spinning disc. A calorimeter having a length equal to the diameter of the workpiece obtains the average implantation dose per unit area over the workpiece.

FIG. 1 schematically illustrates one embodiment of the invention wherein a single calorimeter 10 is mounted on a rotating support disc 11 that carries multiple workpieces 12 through an ion beam 13. For the purposes of illustration, it is constructuve to consider the implantation into silicon workpieces 10 cm. in diameter held on a drum one meter in diameter. The ion beam 13 has a generally rectangular cross section whose long length d is in the radial direction of the disc 11; the length d of the beam 13 is 11 cm. and therefore overlaps the diameter of a workpiece 12. A radial slot 15 is cut into the disc 11 between two workpiece mounting sites. The radial slot 15 has a length greater than the 10 cm. long calorimeter 10. The width of the slot 15 is governed by the distance between workpieces 12 and is typically of the order of a 1.4 cm. to accommodate a calorimeter whose width is 1 cm.

Further details of a spinning disk ion implantation system are disclosed in U.S. Pat. Nos. 4,228,358 and 4,234,797 to Ryding entitled "Wafer Loading Apparatus for Beam Treatment" and "Treating Workpieces with Beams." The disclosure of these two prior art patents is incorporated herein by reference.

Figure 2:
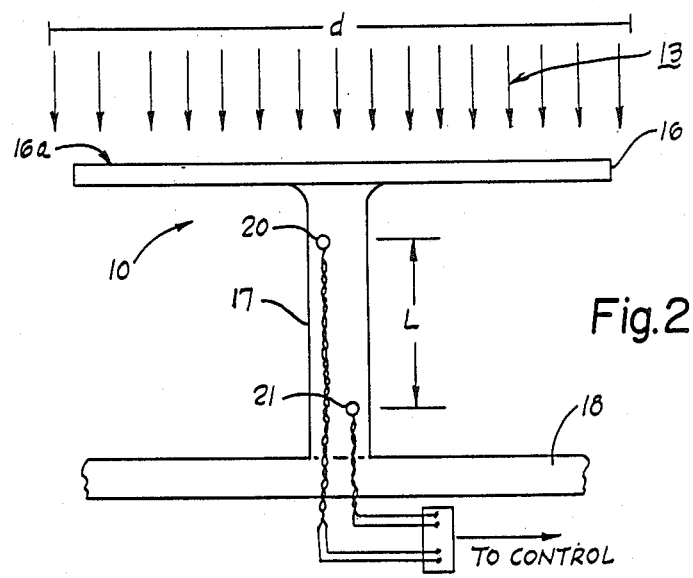
FIG. 2 schematically shows a specific implementation of the calorimeter of FIG. 1.

The calorimeter 10 is constructed from a calorimeter block or mass 16 (FIG. 2) having a beam facing surface 16a. The block 16 is attached to an elongated rod 17 that comprises a thermal path for heat conduction away from the block to a thermal heat sink 18.

The thermal heat sink 18 is kept at a constant temperature $T_1$. The thermal path 17 has a diameter smaller than its length so that the temperature is uniform over a cross sectional area. Temperature measurements are performed with two thermisters 20, 21 at two points along the rod 17. One point is close to the calorimeter mass 16 and a second is close to the heat sink 18.

The temperature difference between the two thermisters 20, 21 is a measure of the thermal power transmitted through the rod 17. A governing equation for power transfer along a long cylinder experiencing a thermal gradient is:

$$P_t = k(T)(A/L)(T_2-T_1) \tag{1}$$

where k(T) is the thermal conductivity of the cylinder (value may depend on temperature) A is the cross sectional area of the cylinder, L is the distance between the points where the temperature is measured and $T_2$ and $T_1$ are the high and low temperatures respectively. Values for k in units of watts/cm./°K, are 4 for copper, 2.4 for aluminum, and 0.7 for platinum.

Well over 99% of the incident ion beam power into the calorimeter surface 16a is transferred by heat conduction to the heat sink 18 through the rod 17. The heat lost by conduction or by convection through the region surrounding the calorimeter 10 is negligible since that region is part of a vacuum system of the implanter. The radiation heat loss is also negligible compared to the heat transferred down the rod 17 since the temperature of the calorimeter never exceeds about 400 degrees Kelvin. The radiant power absorbed by the calorimeter from surrounding walls or components of the ion implanter is also less than 1% of the power introduced by the ion beam. Secondary sources of heat gain or loss can be minimized by proper design of calorimeter area and position and by selecting a calorimeter surface of low emissivity. The positioning of the calorimeter 10 is chosen so that black body radiation from other wafers 12 positioned about the disk 11 is minimized, i.e., edges of the slot 15 shield the calorimeter from those wafers.

The relationship between the power transferred down the rod 17 to the number of particles per second being implanted into the workpieces 12 can be derived.

The total power in watts delivered by the beam onto the support disc 11 is $$P = IV. \tag{2}$$

where I is the total beam current in milliamperes equivalent. (Milliamperes equivalent is defined as the effective beam current wherein each beam particle is treated as having a unit positive charge independent of its actual charge.) and V is the energy of the ions in the beam in kilovolts. The total number of particles, N, delivered by the beam 13 onto the disc surface during a time interval t is given by $$N = 6 \times 10^{15} \, Pt. \tag{3}$$

The number of particles implanted per unit area D is therefore, $$D = N/A = 6 \times 10^{15} \, t \, (P/A) \tag{4}$$

where D is the total area of the disc irradiated by the beam. To first approximation, that area is $\pi(r_2^2 - r_1^2)$, where $r_2$ and $r_1$ are the distance of the outer and inner beam radii from the axis of disc rotation (FIG. 1).

The beam power impinging the calorimeter is p=P(a/D), wehre (a/D) is the ratio of the effective area of the calorimeter to the area D of the disc struck by the beam 13.

The ratio (P/D) for the whole disc is the same as the ratio p/a for the calorimeter 10 so that if the power, p, into a calorimeter of known area, a, is measured then one has a direct measure of the number of particles implanted per unit area, per unit time into the workpieces 12.

The thermal power which is transmitted along the rod 17 is given by Equation 1. The measurement of $P_t$ is a direct and unambiguous measurement of the power transmitted through the rod. The time integral of $P_t$ is the total energy transmitted through the rod during the time interval $t_1$ to $t_2$.

$$E = \int_{t_1}^{t_2} P_t \, dt \tag{5}$$

If the rod 17 is the only thermal path out of the calorimeter 10 then Equations 1 and 5 yield the total power and energy, respectively, delivered by the beam to the calorimeter. Dividing the power and energy values in watts and joules, respectively, by the beam energy in kiloelectron volts, gives the effective beam current and total charge in milliamps and milliCoulombs, respectively, delivered by the beam to the calorimeter. Since the calorimeter area is known, the beam current per unit area and total charge per unit area of implanted beam on the spinning disk 11 are also known from equations 3 and 4.

The time response of the calormeter 10 is determined by the specific embodiment of the calorimeter 10. In the preferred embodiment the calorimeter intercepts the implantation beam 13 periodically for a time which is short compared to the time between interceptions. In that case, the beam delivers an impulse of energy in so short a time that the delivered heat cannot diffuse out of the calorimeter mass 16. (In calculating the time response it is assumed that the calorimeter mass 16 has a thermal diffusion time constant which is very short compared to the period between beam interceptions, and that the rod 17 has negligible mass; a finite but relatively small mass for the rod 17 makes no practical difference to the operation of the calorimeter.)

The temperature rise of the calorimeter mass 16 is determined by its mass m and its heat capacity c, in equation form:

$$T_1 = T_0 + (P\delta t)/(mc) \tag{6}$$

where $T_o$ is the temperature before the beam impulse and $\delta t$ is the impulse time, i.e., the time the calorimeter intercepts the beam each revolution.

The thermal energy gained by the calorimeter mass 16 in a single impulse decays to the heat sink 18 through the rod 17 during the rotation period of the support disc. The temperature of the calorimeter mass decays as energy is transmitted away from the calorimeter mass through the rod. As a function of time after a single impulse this decay is expressed by the relation:

$$T(t) = T_0 e^{-t/\tau} \tag{7}$$

where the time constant of the decay of the temperature is given by $$\tau = \frac{mcL}{kA_c} \tag{8}$$

where L is the length between the transistors 20, 21 and $A_c$ is the cross-sectional area of the rod 17.

The time dependence of the temperature of the calorimeter mass, as measured by the thermistor 20, after n revolutions is thus given by the following sum of terms:

$$T_n = T_o(1 + e^{-nt_o/\tau}) + \Delta T \sum_{m=1}^{n} e^{-mt_o/\tau} \tag{9}$$

where $t_o$ is the time between impulses, i.e., the period of revolution of the support disc.

The asymptotic maximum value of the temperature, reached for practical purposes, in a few hundred revolutions, is given by $$T_{max} = T_o + \Delta T \frac{e^{-t_o/\tau}}{1 - e^{t_o/\tau}} \tag{10}$$
$$\approx T_o + P\delta t \frac{L}{kA_c t_o}$$

Figure 3:
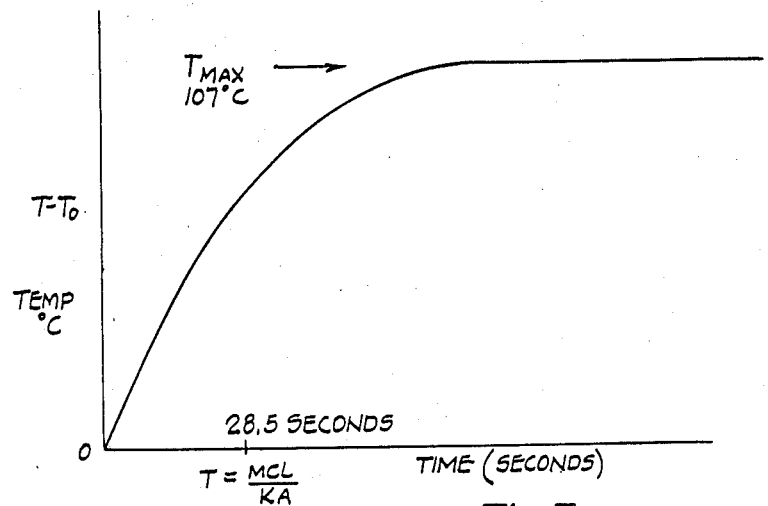
FIG. 3 is a graph showing sensed temperature difference vs. time between two pints on a thermal path connecting a heat sink to the calorimeter.

A simplified time versus temperature plot is shown in FIG. 3 for the case of slow decay (small $\tau$) and, in FIG. 4 for a rapid decay (large $\tau$). In FIG. 4 the teperature excursions are somewhat exaggerated to illustrate the effect of a rapid decay constant. It is relatively easy to adjust the parameters of the time constant to measure the temperature rise per turn or the mean temperature rise over many turns.

The long-time-constant case is essentially that obtained by the steady state equation of energy balance which would be applicable for a stationary disc in which the calorimeter intercepts but a small portion of the beam.

The steady state temperature of the calorimeter mass 16 as a function of time, assuming a constant heat sink temperature is determined by the energy balance:

$$(power\ in) - (power\ out) = mc\ dT/dt. \tag{11}$$

Integrating this equation from $T_o$ to T yields, $$T = T_o + T_{max}(1 - e^{-t/\tau}) \tag{12}$$

where, the time constant $\tau = mcL/(kA)$ is the same as Equation 8 above.

Whether the calorimeter mass intercepts the beam continuously or periodically, at equilibrium, the power p from the beam into the calorimeter equals the power transmitted down the path 7. The maximum temperature, $T_{max}$ is given by $$T_{max} - T_o = \frac{L\ a}{k\ AA_c} P \tag{13}$$

where
a = area of calorimeter
A = surface area of support impacted by the beam
$A_c$ = cross sectional area of the rod
This is the same as Equation 10 since, for a rotating disc $a/D = \delta t/t_o$.

Figure 7:
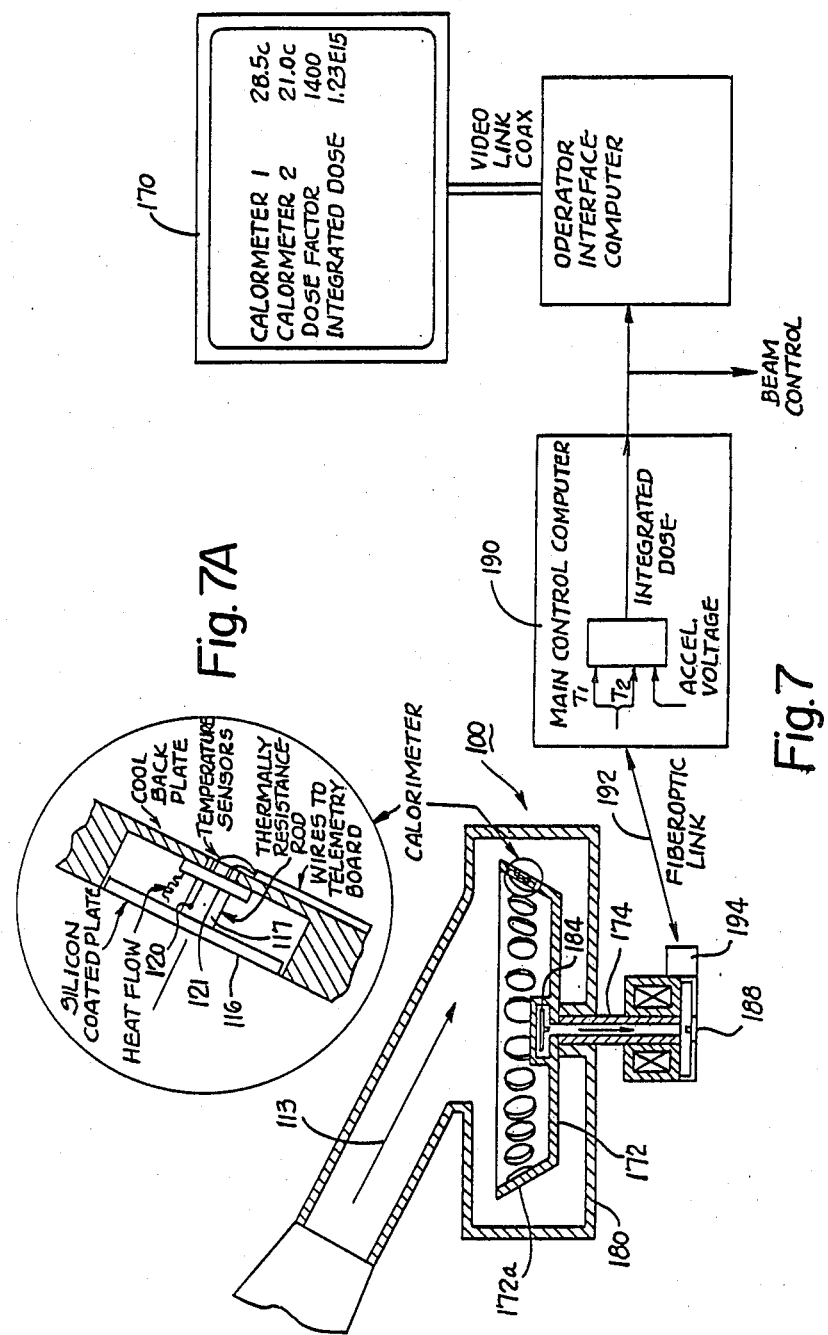
Figure 8:
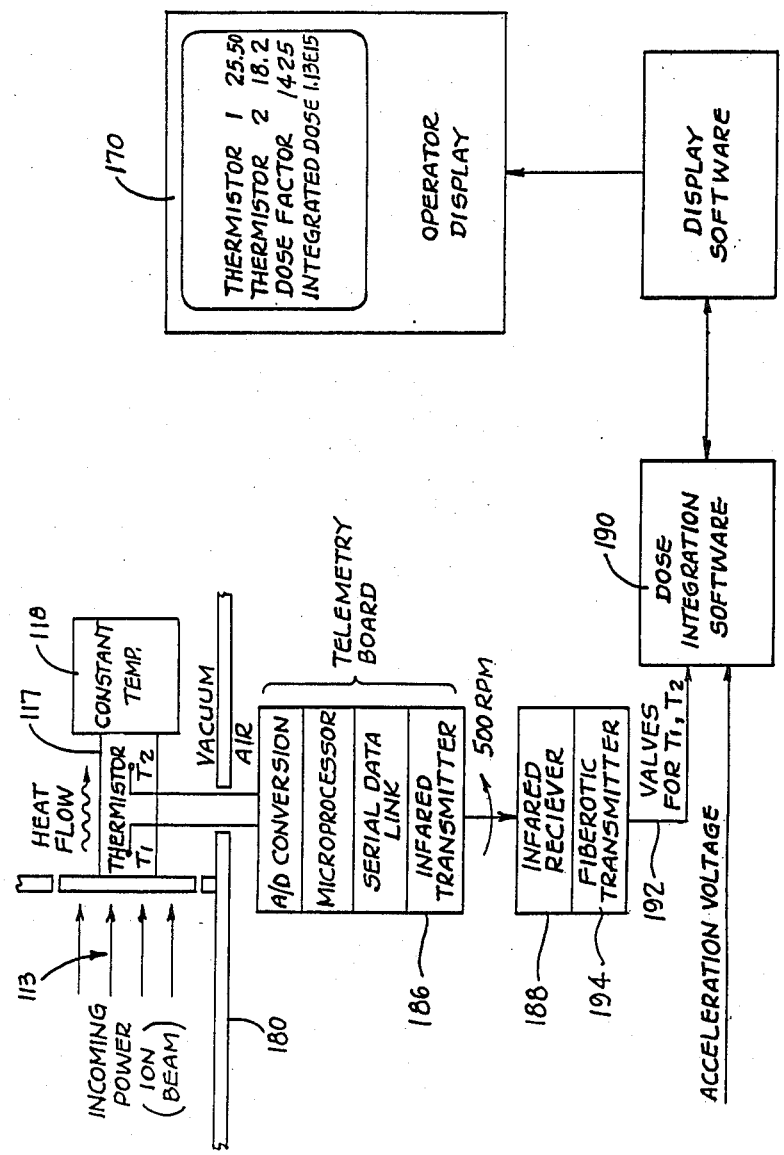

FIGS. 6, 7 and 8 illustrate an ion implantation system 100 where a beam 113 of ions impinges upon workpieces 112 moving within the beam 113. Like the FIG. 2 schematic illustration, A thermistor mass 116 is coupled to a heat sink 118 at constant temperature by a thermal path 117 and two thermistors 120, 121 monitor temperatures along the path 117.

Two analog signals proportional to the temperatures sensed by the thermistors 120, 121 are coupled to an amplifier 140 (FIG. 6) that amplifies the difference between the two signals at an output 142. The analog signal from the amplifier 140 is coupled to an analog-to-digital converter 144 having a control input 146 that causes the converter 144 to produce a digital signal at an output 148.

A controller 150 utilizes this data and the system parameters L, a, k, D, $D_c$ to calculate the beam power and accordingly from Equation 4 the dose per revolution. This dose calculation is output at a digital output 152 and coupled to a comparator 154 having an input 156 where a preset or desired dose per revolution is transmitted to the comparator 154.

A comparator output 160 directs a difference signal to a source beam controller 162. The controller 162 adjusts the voltages on beam shaping, discriminating, and accelerating electrodes to bring the beam power and hence dose into conformity with the preset dose.

The ion implantation system 100 of FIGS. 7 and 8 illustrate one implementation of the control system of FIG. 6 and in addition include a display unit 170 for monitoring the temperature of the thermistors and beam dose. Instead of a planar support disk (FIG. 1) the system 100 has a spinning support cup 172 having sloped walls 172a that bring the workpieces 112 into a beam impact region so that implantation surfaces of the workpiece are impacted by ions moving perpendicular to those implantation surfaces.

The support cup 172 is mounted to a pedestal 174 rotatably supported by suitable bearings (not shown) within an evacuated chamber 180. The pedestal 174 is driven by a motor 182 outside the chamber 180. In this embodiment analog signals from the thermistors 120, 121 are coupled to a telemetry board 184 mounted to the support cup 172. The telemetry board 184 includes circuitry for performing A/D conversion, and then generate a serial data signal to energize an infrared transmitter 186. The transmitter 186 sends data signals to a receiver 188 outside the chamber 180. These signals then retransmitted to a computer 190 along a fiber-optic link 192 by a transmitter 194. The computer 190 does the necessary calculations to determine the total implantation dose as well as instantaneous ion beam dose (dose factor).

EXAMPLES

Typical design parameters for calorimeters for three purposes are given: In the first, the calorimeter is used for obtaining the total dose implantation to a wafer. In the second, a set of calorimeters 10' arranged in a spiral pattern (FIG. 5) around the workpiece holding disc 11', are used to control the uniformity of the beam during the implant. In the third example, one or more of the small calorimeters 10' is designed to give a measure of the beam current in order to control its intensity.

In all three examples the following parameters apply: The ion beam is assumed to have a rectangular cross section 11 cm in the radial direction of the disc and 0.6 cm in the arcial direction of the disc. The beam is oxygen with a fixed energy of 150 kev. The total current is 50 milliampere, so that the total power is 7.5 kilowatts, or 1.14 kilowatts/$cm_2$. The silicon workpieces are 10 cm diameter and are held on a rotating disc at a mean radius of 0.5 meter. The disc rotates at constant angular speed of 200 rpm, so that the period of rotation is $\frac{1}{3}$ second. The general configuration of the calorimeters is that of FIG. 2. The temperature at the calorimeter mass 16 is measured by a thermistor 20. The temperature of the heat sink is measured by a thermistor 21. The length of the path linking the two thermistors is L; the cross sectional area of the rod is $A_c$.

EXAMPLE 1

Total implantation dose control

To measure the total dose, a calorimeter mass is placed radially so as to precisely mimic the workpiece. That is, the radial length of the calorimeter mass is 10 cm so as to exactly match the wafer diameter. The width of the calorimeter mass 16 is 1 cm and its mass is 25 gms of silver coated with a thin silicon layer. The thin silicon coating prevents workpiece contamination from the sputtering of foreign atoms. The front face of the calorimeter is in the plane of the wafers. To measure the total implantation dose it is necessary, as is clear from the discussions above, that the total power through the rod be integrated with respect to time; that is, the time-integral of the temperature difference between thermistors 20, 21 must be determined and the implantation stopped when that time integral reaches a predetermined value.

As a practical matter one would like the time constant, Equation 8, to be long compared to a rotational period but short compared to the total time for implantation. Also, one would like the maximum temperature of the calorimeter mass 16 to be large enough for reliable measurement but not so large that radiation losses are important. A suitable choice of parameters are as follows: Calorimeter mass of 25 gms of silver having a specific heat of 0.24 joules/gm/°C.; thermal link or rod made of nickel, which is 2 cm long, has a cross-sectional are of 0.7 $cm^2$, and a thermal conductivity of 0.6 joules/sec/cm/°C. The time constant for temperature rise (or decay) is 28.5 seconds which is short compared to the typical oxygen implant of several hours but long compared to a rotational period. The temperature rise per revolution is 1.25° C. The asymptotic temperature maximum, reached in a few minutes of operation, is 107° C. The radiation losses are still only a few percent at this temperature. If the radiation losses are deemed too large, they can be made negligable by changing the rod to tungsten which reduces the maximum temperature to 32° C. and the time constant to 8.5 seconds, without a change in the temperature rise per revolution.

EXAMPLE 2

Control of beam uniformity

By placing small calorimeters 10' (FIG. 5) between each workpiece in a spiral arrangement so that each calorimeter samples a separate portion of the radial extent of the beam, it is a straightforward matter to use the resulting power levels through the individual thermal links to control the uniformity of the beam. The beam profile is very sensitive to the extraction voltage of the ion beam source and to the focusing of a quadrupole lens placed just after the source. A feedback loop involving one or both of these units is practical to control the uniformity of the beam to the requirements of the user.

The calorimeter used for these controls should have modest time constants of a few seconds to respond to the generally smooth and slow changes which occur. The temperature rise per power level change should be well within the range of temperature measuring techniques.

A reasonable choice of calorimeter parameters is a 1 $cm^2$ silicon-coated silver mass weighing 1 gm attached to a nickel thermal mass 2 cm long and cross-section 0.7 $cm^2$. The time constant for the calorimeter is 3.2 seconds and the maximum temperature rise is 46° C. for a beam power density of 1.14 kilowatts/$cm^2$ acting for one millisecond per revolution on the calorimeter mass. Thus a 5% change in the power level on a given calorimeter will change the maximum temperature, which in this case is proportional to the mean temperature, by an easily measured 2.3° C.

EXAMPLE 3

Beam intensity control

To use the calorimeter for a beam monitor control it is useful to have a time constant which is short compared to a rotational period but long compared to the 1 ms dwell time of the beam on the calorimeter mass. One also wants the temperature rise per rotation to be large enough so that accurate measurements can be made. Only one such calorimeter, sampling, for example, the center of the beam, is generally necessary. More calorimeters to sample several areas can of course be added. It should also be clear that these calorimeters can be placed in fixed positions behind the disc which holds the workpiece since only the relative dose to the workpiece rather than the absolute implant is needed. In that case, the rotating disc would have appropriate holes to allow the beam to penetrate to the calorimeters. Such an arrangement of holes and fixed calorimeters could be practical for the beam profile monitor (Example 2 above) as well. One advantage of such a system is that the task of sending communication signals from a spinning disk to a stationary receiver would be avoided.

To construct a short time constant calorimeter it is necessary that the thermal link be short and made from high thermal conductive material. A copper link, k=4.2 joules/sec/cm/°C., 1 cm long and 1 cm² crosssection, connected to an 0.5 gm mass of silicon-coated silver having an area of 1 cm², gives suitable values. The temperature rise per revolution is almost 10° C., the time constant for decay is 0.03 seconds, which is 30 times the impulse time and 10 times shorter than a disc period. The temperature of the thermistor closest to the calorimeter mass varies from the bath temperature to a temperature governed by the impulse beam current. The power in watts through the thermal link, integrated over a disc rotation period to give the total energy absorbed in joules, and divided by the beam energy in kilovolts, is a direct measure of the beam current on the calorimeter in milliamperes.

The examples above are illustrative of the ability of the calorimeter to control the essentials beam parameters of ion implantation; i.e., the total implant dose, the uniformity of that dose as a function of time and the instantaneous current being supplied.

Equation 12 is plotted in FIG. 3, for the parameters of Example 1. At equilibrium, the temperature of the calorimeter rises about 1° K. during each pass through the beam and the temperature drops by 1° K. during the one revolution between beam passages. The temperature at thermister 20 rises to within 1% of its equilibrium value in about two minutes. The long time constant of 28.5 seconds smooths any variations in the beam current.

The coefficient of thermal conductivity of most materials is temperature dependent. For tungsten, the functional relation, in the room temperature range (273°<T<373°), is $$k(T) = k_o[1 + 0.0001(T - T_o)] \quad (14)$$

Thus k changes only 1% over a 100° temperature rise. The effect is negligible for implants of long duration, but in any event can be readily taken into account in the computer software used to determine the dose.

The thermal time constant can be adjusted over a wide range of times from a fraction of a second to minutes by suitable choice of material and geometry for the thermal path 17.

The power deposited by the beam 13 into the calorimeter 10 depends only on the number and energy of the implanted atoms. The power is independent of whether the atom is an ion or whether it is electrically neutral so that the measured power is independent of charge changing which can be significant when the vacuum in the implanter chamber rises above $10^{-5}$ Torr.

The power deposited by electrons impinging on the calorimeter can be neglected. The directed power in the electrons present in the implantation volume is given by the product of the current of electrons times their energy. The energy of the electrons is, on average, less than 10 electron volts while the electron intensity is never greater than 100 times that of the ions. Thus, the power in the free electron in the emplantation volume, is always less than 1% of that in the beam of ions of 150 keV. In most practical situations the power in the electrons is less than 0.1% of that in the ion beam.

The power lost from the calorimeter by ion sputtering is also negligible since the number of sputtered atoms is about equal to that of the impinging ions—the sputtering coefficient is of order unity—while the energy of the atoms sputtered from the surface is of the order of electron volts.

It will be understood that the above specific descriptions and drawings have been given for purposes of illustration only and that variations, modifications, and other combinations of the illustrations and specifications herein described can be made by those skilled in the art without departing from the spirit and scope of the appended claims.

We claim:

1. A method for determining ion beam dose during ion implantation of semiconductor wafers comprising the steps of:
   accelerating a beam of ions and directing the ions to impinge upon an ion implant station;
   moving one or more semiconductor wafers and a calorimeter having a beam facing surface through said ion beam to allow energy from the beam to be periodically transferred to the calorimeter as the one or more semiconductor wafers are treated by the ion beam;
   coupling the beam facing surface of the calorimeter to a heat sink through a thermal path;
   monitoring a thermal gradient along the thermal path created by heat transferred from the beam of ions to the beam facing surface of said calorimeter;
   determining beam power impinging upon the calorimeter beam facing surface from the thermal gradient based upon the thermal characteristics of the thermal path; and
   correlating beam power per unit area impinging upon the beam facing surface of the calorimeter with the dose of ions impinging upon the wafers.

2. Apparatus for determining ion beam dose during ion implantation of semiconductor wafers comprising:
   ion source means for directing a beam of ions to an implant station;
   semiconductor wafer support means comprising a disk mounted for rotation and having multiple implantation sites for periodically rotating one or more semiconductor wafers through the ion beam to treat said wafers;

calorimeter means fixed to said wafer support means between two of the implantation sites and having a beam facing surface to periodically intercept said beam, said calorimeter means including thermal path means for conducting heat generated when the ions impact the beam facing surface away from said beam facing surface along the thermal path means;

heat sink means maintained at a reference temperature in thermal contact with said thermal path means for maintaining a portion of the thermal path means at a relatively uniform temperature;

temperature sensing means for measuring a temperature difference between two points along said thermal path; and means for converting said temperature difference to a beam dose.

3. An apparatus of claim 2 wherein the beam facing surface of said calorimeter is generally rectangular and has a length approximately equal to a maximum width of said wafers.

4. The apparatus of claim 2 wherein the temperature sensing means comprises two thermistors spaced along the thermal path for converting a temperature into an electrical output.

5. The apparatus of claim 4 wherein the thermal path means comprises a tungsten rod coupled to a calorimeter mass at one end and the heat sink at an opposite end.

6. The apparatus of claim 3 where the calorimeter means comprises a silicon layer covering a silver calorimeter mass.

7. The apparatus of claim 2 where the calorimeter means comprises a number of different calorimeter masses spaced to intercept different portions of the ion beam, each having a separate thermal path means.

8. Apparatus for determining ion beam dose during ion implantation of semiconductor wafers comprising:

ion source means for directing a beam of ions to an implant station;

semiconductor wafer support means comprising a disk mounted for rotation having a support surface defining multiple implantation sites for rotating one or more semiconductor wafers through the ion beam to treat said wafers said support surface defining at least one opening to intercept said beam of ions at periodic intervals to define at least one beam dose determining position;

calorimeter means fixed to the disk between two of the implantation sites having a beam facing surface positioned to periodically intercept said beam as said at least one opening intercepts said beam, said calorimeter means including thermal path means for conducting heat away from said surface as the heat is generated by beam impingement on the beam facing surface of the calorimeter;

heat sink means in thermal contact with said thermal path for maintaining a part of the thermal path means at a reference temperature;

temperature sensing means for measuring a temperature gradient along said thermal path; and means for converting said temperature gradient to a beam dose.

9. The apparatus of claim 8 where the disk defines a multiple number of openings spaced at different distances from an axis of disk rotation and the calorimeter means comprises multiple calorimeter surfaces positioned to monitor beam dose as the beam intercepts the openings at different distances from the axis of disc rotation to sample different portions of the beam of ions and the means for converting includes means for determining ion beam dose at said multiple number of opening.

10. The apparatus of claim 8 where the means to convert additionally comprises control means to adjust beam dose to a desired level.

* * * * *